US010365319B2

(12) United States Patent
Sumiyoshi

(10) Patent No.: US 10,365,319 B2
(45) Date of Patent: Jul. 30, 2019

(54) APPARATUS FOR DETERMINING DETERIORATION OF PHOTOCOUPLER

(71) Applicant: DENSO WAVE INCORPORATED, Chita-gun, Aichi-pref. (JP)

(72) Inventor: Yoko Sumiyoshi, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 80 days.

(21) Appl. No.: 14/611,642

(22) Filed: Feb. 2, 2015

(65) Prior Publication Data
US 2015/0219711 A1 Aug. 6, 2015

(30) Foreign Application Priority Data

Feb. 3, 2014 (JP) .................................. 2014-018682

(51) Int. Cl.
*G01R 31/26* (2014.01)
(52) U.S. Cl.
CPC ..... *G01R 31/2635* (2013.01); *G01R 31/2637* (2013.01)
(58) Field of Classification Search
CPC ............ G01R 31/2608; G01R 31/2635; G01R 31/2637; G01R 31/2853; G01R 31/31728
See application file for complete search history.

(56) References Cited

U.S. PATENT DOCUMENTS

| 2003/0038650 A1* | 2/2003 | Combs | G01R 31/2853 |
| | | | 324/754.1 |
| 2004/0145923 A1* | 7/2004 | Van Bodegraven | |
| | | | H02M 3/33507 |
| | | | 363/20 |
| 2008/0239760 A1* | 10/2008 | Telefus | H02M 3/33523 |
| | | | 363/21.01 |
| 2013/0158920 A1* | 6/2013 | Bucsa | H02H 3/087 |
| | | | 702/64 |
| 2014/0119739 A1* | 5/2014 | Maasi | H04B 10/802 |
| | | | 398/158 |
| 2014/0312871 A1* | 10/2014 | Alley | G01R 19/00 |
| | | | 323/299 |

FOREIGN PATENT DOCUMENTS

JP 2009071928 A 4/2009

* cited by examiner

*Primary Examiner* — Son T Le
*Assistant Examiner* — Dustin R Dickinson
(74) *Attorney, Agent, or Firm* — Oliff PLC

(57) ABSTRACT

An apparatus is provided to determine deterioration of a photocoupler. The apparatus includes a detecting unit and a determining unit. The detecting unit receives an electric pulse signal outputted from the photocoupler. The amplitude of the outputted pulse signal depends on that of an electric AC voltage applied to the photocoupler. The detecting unit detects a duty ratio of the pulse signal. The determining unit determines whether or not the duty ratio is less than a threshold given for the determination. The determining unit also determines that the photocoupler has deteriorated in performance thereof more than a usable level if it is determined that the duty ratio is less than the threshold given for the determination.

12 Claims, 4 Drawing Sheets

FIG.2A
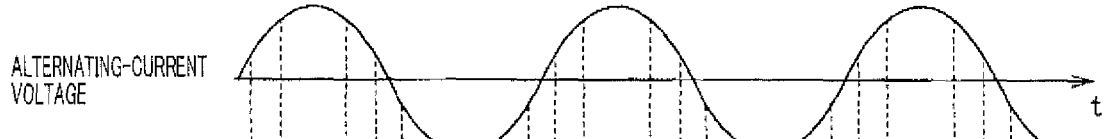
FIG.2B
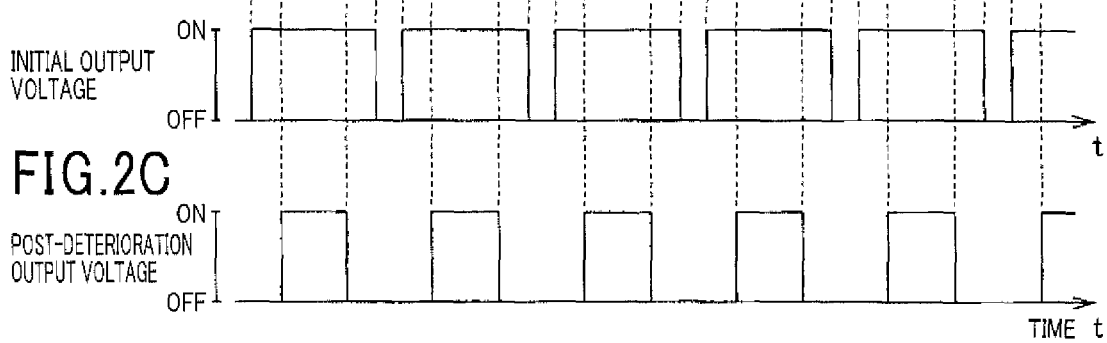
FIG.2C

ALTERNATING-CURRENT VOLTAGE

INITIAL OUTPUT VOLTAGE

POST-DETERIORATION OUTPUT VOLTAGE

INITIAL OUTPUT VOLTAGE (AFTER FILTERING)

POST-DETERIORATION OUTPUT VOLTAGE (AFTER FILTERING)

TIME t

APPARATUS FOR DETERMINING DETERIORATION OF PHOTOCOUPLER

CROSS-REFERENCE TO RELATED APPLICATION

This application is based on and claims the benefit of priority from earlier Japanese Patent Application No. 2014-018682 filed on Feb. 3, 2014 the descriptions of which are incorporated herein by reference.

BACKGROUND OF THE INVENTION

[Field of the Invention]

The present invention relates to an apparatus that detects the deterioration of a photocoupler to which a predetermined alternating-current (AC) voltage is applied.

[Description of the Related Art]

Conventionally, there is a technology in which the output voltage of a photocoupler, to which a predetermined direct-current voltage is applied, is compared to a reference voltage by a comparator. The photocoupler is determined to have deteriorated when the output voltage of the photocoupler is lower than the reference voltage (refer to JP-A-2009-71928).

The technology described in JP-A-2009-71928 requires the addition of a power supply that generates the reference voltage and the comparator that compares the output voltage of the photocoupler to the reference voltage. Therefore, increase in circuit size is unavoidable. Determination of the deterioration of a photocoupler is also desired for photocouplers to which a predetermined alternating-current voltage is applied.

SUMMARY

Accordingly it is desired to suppress increase in circuit size in an apparatus that determines the deterioration of a photocoupler to which a predetermined alternating-current voltage is applied.

In an exemplary embodiment, the apparatus of determining deterioration of a photocoupler is provided. The apparatus comprises a detecting unit receiving an electric pulse signal outputted from the photocoupler depending on an electric AC voltage applied to the photocoupler and detecting a duty ratio of the pulse signal; a determining unit determining whether or not the duty ratio is less than a threshold given for the determination and determining that the photocoupler has deteriorated in performance thereof more than a usable level if it is determined that the duty ratio is less than the threshold given for the determination.

In the above-described configuration, a predetermined alternating-current voltage is applied to the photocoupler. The photocoupler outputs a pulse signal based on the predetermined alternating-current voltage. Here, when the photocoupler has deteriorated, the current transfer ratio, which is a ratio of the current flowing to a phototransistor to the current flowing to light-emitting diodes of the photocoupler, decreases. The inventors of the present application have focused on the fact that, in the photocoupler that outputs the pulse signal based on the applied predetermined alternating-current voltage, the duty ratio of the pulse signal outputted by the photocoupler (the current flowing to the phototransistor) decreases as a result of decrease in the current transfer ratio (CTR). Therefore, the determination that the photocoupler has deteriorated can be made when the duty ratio of the pulse signal is less than the threshold. As a result, a power supply for generating a reference voltage and a comparator for comparing the output voltage of the photocoupler to the reference voltage are not required to be added. Increase in circuit size can be suppressed.

It is preferred that the threshold is set a predetermined percentage in relation to the duty ratio of the pulse signal outputted by a reference photocoupler that has not deteriorated.

The predetermined alternating-current voltage applied to the photocoupler may differ depending on the user who is using the photocoupler. In this case, when the threshold is determined by the absolute value of the duty ratio, the setting of the threshold is required to be changed depending on the applied alternating-current voltage.

In this regard, in the above-described configuration, the threshold is set to a predetermined percentage in relation to the duty ratio (initial duty ratio) of the pulse signal outputted by a reference photocoupler that has not deteriorated. For example, when the predetermined percentage is 30% of the initial duty ratio, the thresholds are respectively set to 24% and 18% when the initial duty ratios are 80% and 60%. Therefore, the setting of the threshold can be uniformly performed regardless of the applied alternating-current voltage Specifically, a photocoupler of which the period of use is less than a predetermined period (such as a photocoupler that is being used for the first time) can be used as the predetermined photocoupler that has not deteriorated. In a configuration such as this, whether or not the photocoupler has deteriorated can be determined with reference to a photocoupler of which the period of use is less than a predetermined period.

In another exemplary embodiment, there is provided an apparatus of determining deterioration of a photocoupler, comprising: a low-pass filter reducing high-frequency components of an inputted electric signal; a detecting unit receiving an outputted pulse signal from the low-pass filter and detecting the outputted pulse signal; and a determining unit determining whether or not an amount of the outputted signal is less than a predetermined amount, the amount of the outputted signal exceeding a threshold, and determining that the photocoupler has deteriorated in performance thereof more than a usable level if it is determined that the amount of the outputted signal is less than the predetermined amount.

The pulse signal that is outputted by the photocoupler may pass through the low-pass filter that attenuates the high-frequency components of a signal. In this case, the duty ratio of the pulse signal that has passed through the low-pass filter may be unclear.

In this regard, in the above-described configuration, the photocoupler is determined to have deteriorated when the amount by which the low-pass filtered pulse signal exceeds a threshold is less than a predetermined amount. Therefore, the deterioration of the photocoupler can be accurately determined even when the pulse signal has been passed through a low-pass filter.

Specifically, a configuration can be used in which, when the amount by which the low-pass filtered pulse signal exceeds the threshold is zero, or in other words, when the pulse signal that has passed through the low-pass filter does not exceed the threshold, the photocoupler is determined to have deteriorated. In a configuration such as this, the deterioration of the photocoupler can be easily determined.

In a further example, the deterioration determination apparatus uses a circuit that is already present and that detects the ON-period and the OFF-period of the pulse signal outputted by the photocoupler.

In the above-described configuration, the deterioration determination apparatus uses a circuit that is already present and that detects the ON-period and the OFF-period of the pulse signal outputted by the photocoupler. Therefore, new hardware is not required to be added. The deterioration of the photocoupler can be determined by software.

In a seventh means, the deterioration determination apparatus is applied to a programmable logic controller (PLC).

Size reduction of the PLC is desired. Therefore, the deterioration of the photocoupler is required to be determined without components being added. In this regard, in the above-described configuration, the photocoupler is determined to have deteriorated based on the level of the pulse signal. Therefore, the deterioration of the pulse signal can be determined without components being added.

BRIEF DESCRIPTION OF THE DRAWINGS

In the accompanying drawings:

FIG. 2A to FIG. 2C are time charts of an alternating-current voltage, an initial output voltage, and a post-deterioration output voltage;

DETAILED DESCRIPTION OF THE PREFERRED EMBODIMENTS

Figure 1:
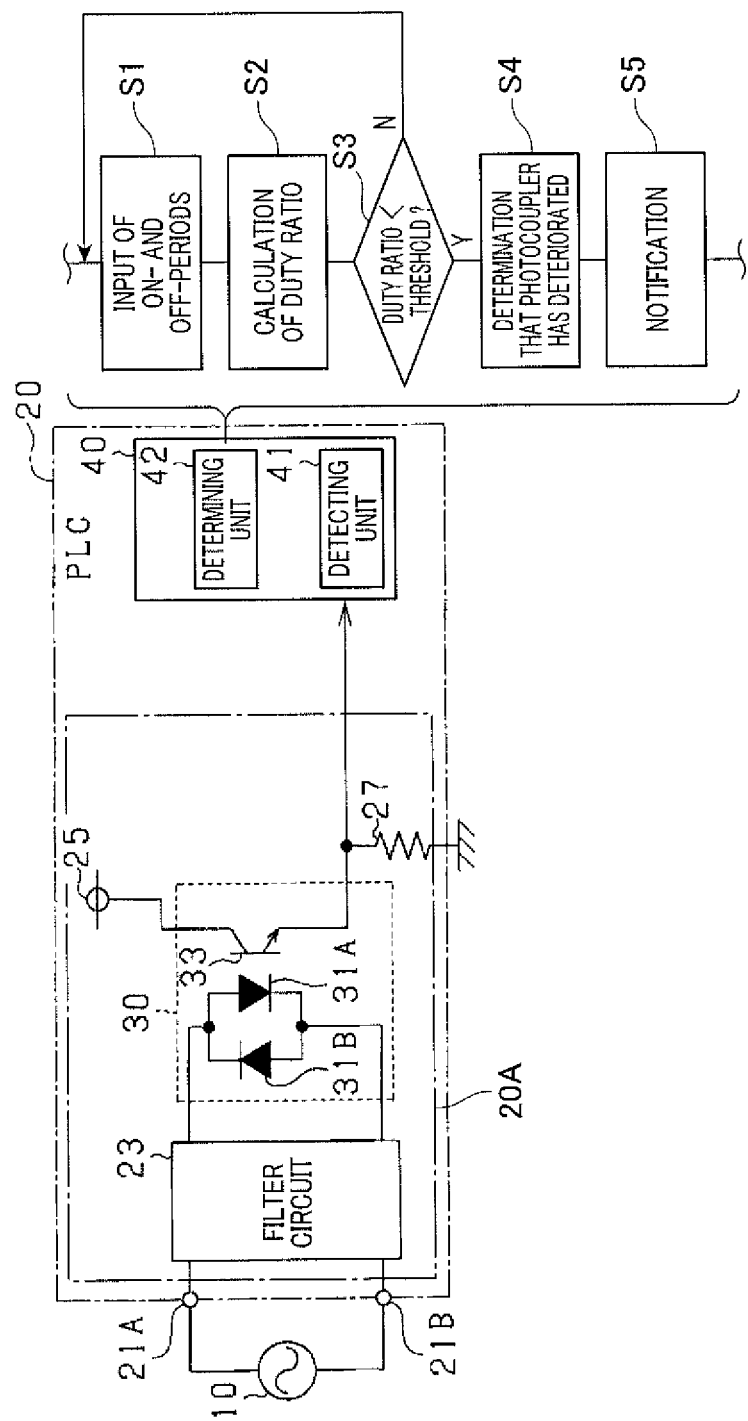
FIG. 1 is a circuit diagram of an alternating-current voltage input circuit and a processor of a PLC according to a first embodiment.

Referring to the drawings, various embodiments of an apparatus for determining deterioration of a photocoupler, which is according to the present invention, will now be described.

(First Embodiment)

Referring to FIGS. 1 and 2, an apparatus for determining deterioration of a photocoupler, which is called simply a "deterioration determining apparatus," will now be described. In the first embodiment, this deterioration determining apparatus is integrally incorporated in a programmable logic controller (PLC). The PLC is provided therein with an alternating-current voltage input circuit to which an alternating-current (Ac) voltage is applied.

As shown in FIG. 1, a PLC 20 includes an alternating-current voltage input circuit 20A to which an AC voltage is applied and a processor 40 which is produced as an application-specific integrated circuit (ASIC).

The alternating-current voltage input circuit 20A includes input terminals 21A and 21B, a filter circuit 23 for noise reduction, a photocoupler 30, a direct-current power supply 25, and a resistor 27. The input terminals 21A and 21B are connected to an alternating-current power supply 10. The alternating-current power supply 10 outputs a predetermined alternating-current voltage (such as an alternating-current voltage of 100 V). The input terminals 21A and 21B are connected to the input terminal of the photocoupler 30 via the filter circuit 23 for noise reduction. The output terminal of the photocoupler 30 is connected to the input terminal of the processor 40, as well as to the ground via the resistor 27.

In the present embodiment, the processor 40 is provided as a deterioration determining apparatus.

The photocoupler 30 includes light-emitting diodes 31A and 31B and a phototransistor 33. The light-emitting diodes 31A and 31B are connected in anti-parallel to the input terminal of the photocoupler 30. The collector of the phototransistor 33 is connected to the positive electrode of the direct-current power supply 25. The direct-current power supply 25 outputs a predetermined direct-current voltage. The emitter of the phototransistor 33 is connected to the output terminal of the photocoupler 30. When current flows to the light-emitting diodes 31A and 31B, the current flows to the phototransistor 33 and an electric pulse signal is outputted from the output terminal of the photocoupler 30. The current that flows to the phototransistor 33 is proportional to the current flowing to the light-emitting diodes 31A and 31B. The ratio of the current flowing to the phototransistor 33 to the current flowing to the light-emitting diodes 31A and 31B is a current transfer ratio (CTR).

The processor 40 is provided as an ASIC which is an integrated circuit provided with one or more processing circuit, memories, input/output interfaces, and other necessary circuits in order to achieve desired purposes given to the processor 40. Hence, such components of the processor 40 functionally provide a detecting unit 41 and a determining unit 42. The detecting unit 41 is a circuit that is already present in the processor 40 and receives input of the pulse signal outputted from the output terminal of the photocoupler 30. The detecting unit 41 detects the ON-period and the OFF-period of the inputted electric pulse signal and outputs the ON-period and the OFF-period to the determining unit 42.

The determining unit 42 receives input of the ON-period and the OFF-period outputted from the detecting unit 41 (refer to step S1 in FIG. 1) and calculates the duty ratio of the pulse signal based on the ON-period and the OFF-period (refer to step S2 in FIG. 1). The determining unit 42 (composing a part of the deterioration determination apparatus) then determines that the photocoupler 30 has deteriorated in its performance more than a normally usable level thereof for a user when the duty ratio of the pulse signal is less than a threshold (refer to steps S3 and S4 in FIG. 1). This threshold is previously given as a reference value such that this determination can be performed. Steps S1-S5 in FIG. 1 show functions of the determining unit 42.

Next, determination of the deterioration of the photocoupler 30 performed by the determining unit 42 will be described in detail with reference to FIG. 2A to FIG. 2C.

The alternating-current power supply 10 outputs the predetermined alternating-current voltage and inputs the alternating-current voltage to the input terminals 21A and 21B of the alternating-current voltage input circuit 20A of the PLC 20. The alternating-current voltage that has been inputted to the input terminals 21A and 21B is inputted to the input terminal of the photocoupler 30 via the filter circuit 23. FIG. 2A indicates the alternating-current voltage inputted to the input terminal of the photocoupler 30. In FIGS. 2A-2C, the vertical axes show amplitudes of voltage and the lateral axes show time t.

When a positive voltage is applied to the input terminal of the photocoupler 30, current flows to the light-emitting diode 31k When a negative voltage is applied, current flows to the light-emitting diode 31B. When current flows to the light-emitting diode 31A or the light-emitting diode 31B, the phototransistor 33 is turned ON and current flows from the collector to the emitter. As a result, the output terminal of the photocoupler 30 outputs an ON (high-level) pulse signal.

When current does not flow to the light-emitting diode 31A and the light-emitting diode 31B, the phototransistor 33 is turned OFF. The output terminal of the photocoupler 30 outputs an OFF (low-level) pulse signal.

FIG. 2B indicates a pulse signal that is outputted by a reference photocoupler 30 of which the period of use is less than a predetermined period (such as a photocoupler 30 that is being used for the first time), or in other words, a predetermined photocoupler 30 that has not deteriorated. In this case, the duty ratio (initial duty ratio) of the pulse signal is substantially 80%.

Here, when the photocoupler 30 deteriorates in its current transfer ratio (CTR) characteristics, the current transfer ratio of the light-emitting diodes 31A and 31B and the phototransistor 33 of the photocoupler 30 decreases. The inventors of the present application have focused on the fact that, in the photocoupler 30 that outputs the pulse signal based on the applied predetermined alternating-current voltage, the duty ratio of the pulse signal outputted by the photocoupler 30 decreases as shown in FIG. 2C, as a result of the decrease in the current transfer ratio. Specifically, when the current transfer ratio decreases, the phototransistor 33 does not turn ON unless a higher voltage is inputted to the light-emitting diodes 31A and 31B (input terminals) of the photocoupler 30. As a result, the duty ratio of the pulse signal is smaller, compared to that of the predetermined photocoupler 30 that has not deteriorated.

According to the present embodiment, when the duty ratio of the pulse signal outputted by the photocoupler 30 is less than the threshold, the photocoupler 30 is determined to have deteriorated. However, the predetermined alternating-current voltage applied to the photocoupler 30 may differ depending on the user who is using the photocoupler 30. In this case, when the threshold is determined by the absolute value of the duty ratio, the setting of the threshold is required to be changed depending on the applied alternating-current voltage.

In this regard, the determining unit 42 sets the threshold to be 40% (predetermined percentage) of the initial duty ratio 80%, or in other words, a duty ratio of 32%. When the duty ratio of the pulse signal outputted by the photocoupler 30 is less than 32%, the determining unit 42 determines that the photocoupler 30 has deteriorated. When determined that the photocoupler 30 has deteriorated more than its normally usable level for a user, the determining unit 42 performs a process to notify the user of the deterioration or the like (step S5 in FIG. 1).

The present embodiment that has been described in detail above has the following advantages.

The inventors of the present application have focused on the fact that, in the photocoupler 30 that outputs the pulse signal based on the applied predetermined alternating-current voltage, the duty ratio of the pulse signal outputted by the photocoupler 30 (the current flowing to the phototransistor 33) decreases as a result of decrease in the current transfer ratio (CTR). Therefore, the determination that the photocoupler 30 has deteriorated can be made when the duty ratio of the pulse signal is less than the threshold. As a result, a power supply for generating the reference voltage and a comparator for comparing the output voltage of the photocoupler 30 to the reference voltage are not required to be added. Increase in circuit size can be suppressed.

The threshold is set to a predetermined percentage in relation to the duty ratio (initial duty ratio) of the pulse signal outputted by a predetermined photocoupler 30 that has not deteriorated. Therefore, the setting of the threshold can be uniformly performed regardless of the applied alternating-current voltage.

As the predetermined photocoupler 30 that has not deteriorated, a photocoupler 30 of which the period of use is less than a predetermined period (such as a photocoupler 30 that is being used for the first time after being produced) is used. Therefore, whether or not the photocoupler 30 has deteriorated can be determined with reference to a photocoupler 30 of which the period of use is less than a predetermined period.

The determining unit 42 uses the detecting unit 41, which is a circuit that is already present and that detects the ON-period and the OFF-period of the pulse signal outputted by the photocoupler 30. Therefore, new hardware is not required to be added. Determination of the deterioration of the photocoupler 30 can be made by software.

The photocoupler 30 is determined to have deteriorated based on the level of the pulse signal. Therefore, determination of the deterioration of the photocoupler 30 can be made without components being added.

The above-described embodiment may be modified as follows.

The determining unit 42 may set the threshold to a percentage other than 40% of the initial duty ratio 80%, such as 30% of the initial duty ratio 80%.

When the setting of the threshold is changed depending on the applied alternating-current voltage, the threshold can be determined by the absolute value of the duty ratio. For example, when the alternating current power supply 10 outputs an alternating-current voltage of 100 V, the threshold may be set to a duty ratio of 30%.

When the alternating current power supply 10 outputs an alternating-current voltage of 80 V, the threshold may be set to a duty ratio of 20%.

(Second Embodiment)

Figure 3:
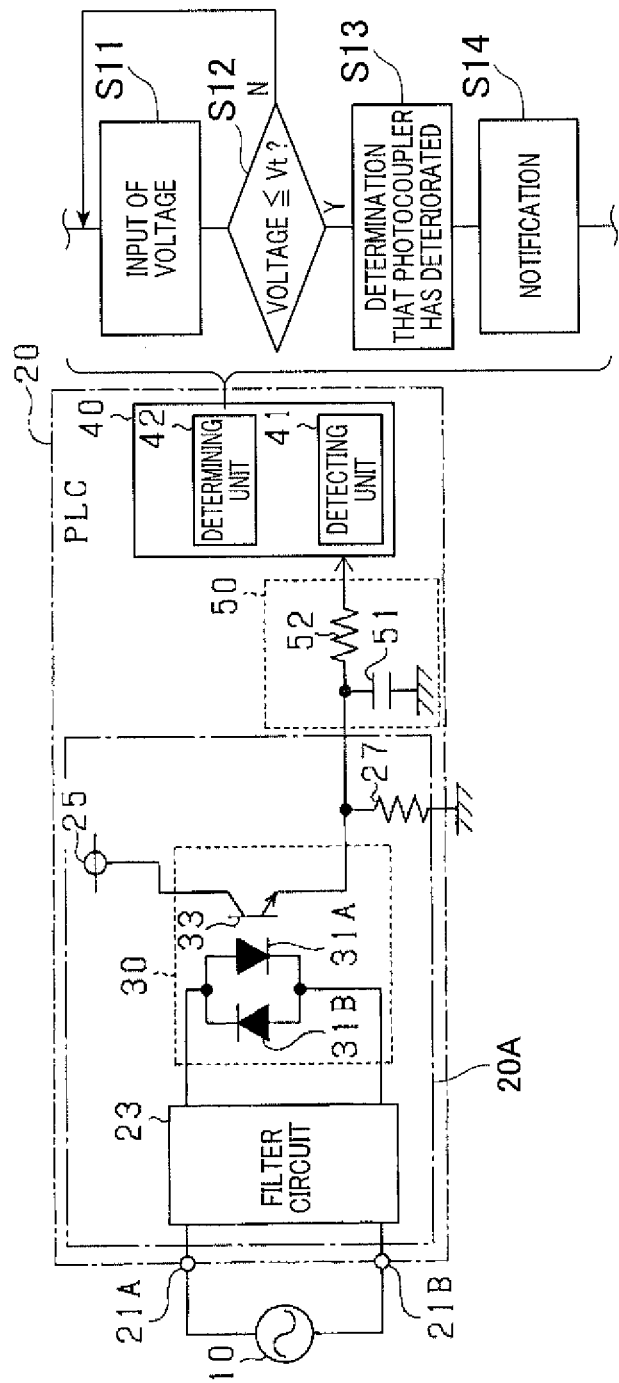
FIG. 3 is a circuit diagram of an alternating-current voltage input circuit and a processor of a PLC according to a second embodiment.

Referring to FIGS. 3 and 4, a second embodiment of the determination apparatus will now be described with reference to the drawings.

According to the present embodiment, as shown in FIG. 3, the pulse signal outputted by the photocoupler 30 is inputted to the processor 40 after passing through a low-pass filter 50. The points that differ from the first embodiment will now mainly be described hereafter. Components that are the same as those according to the first embodiment are given the same reference numbers. Therefore, descriptions thereof are omitted.

The output terminal of the photocoupler 30 is connected to the input terminal of the low-pass filter 50. The output terminal of the low-pass filter 50 is connected to the input terminal of the processor 40. In other words, the pulse signal outputted by the photocoupler 30 is inputted to the processor 40 via the low-pass filter 50.

In the present embodiment, the deterioration determining apparatus is provided by the low-pass filter 50 and the processor 40.

The low-pass filter 50 includes a capacitor 51 and a resistor 52. One electrode of the capacitor 51 is connected to the output terminal of the photocoupler 30 and the resistor 52. The other electrode of the capacitor 51 is connected to the ground. The resistor 52 is connected between the output terminal of the photocoupler 30 and the input terminal of the processor 40. The low-pass filter 50 attenuates the high-frequency components of the signal passing through the low-pass filter 50.

The detecting unit 41 detects the voltage of the inputted signal (the pulse signal that has passed through the low-pass filter 50), and outputs the detected voltage to the determining unit 42. The determining unit 42 receives input of the voltage outputted from the detecting unit 41 (refer to step S11 in FIG. 3) and determines whether or not the inputted voltage exceeds a threshold Vth (refer to step S12 in FIG. 3). When determined that the inputted voltage does not exceed the threshold Vth, the determining unit 42 (composing a part of the deterioration determination apparatus) determines that the photocoupler 30 has deteriorated more than its normally usable level for a user (refer to steps S13 in FIG. 3). The threshold Vth is set to a voltage enabling determination that the photocoupler 30 has deteriorated in such a manner. Steps S11-S14 in FIG. 1 show functions of the determining unit 42.

Next, the determination of the deterioration of the photocoupler 30 performed by the determining unit 42 will be described with reference to FIG. 4.

Figure 4A:
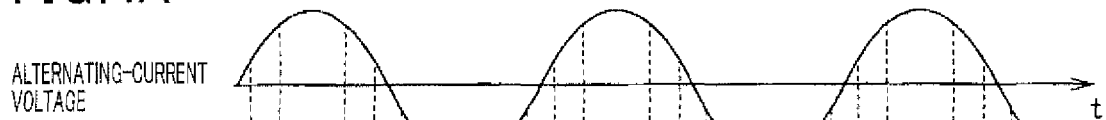
FIG. 4A to FIG. 4E are time charts of an alternating-current voltage, an initial output voltage, a post-deterioration output voltage, an initial output voltage (after filtering), and a post-deterioration output voltage (after filtering).
Figure 4B:
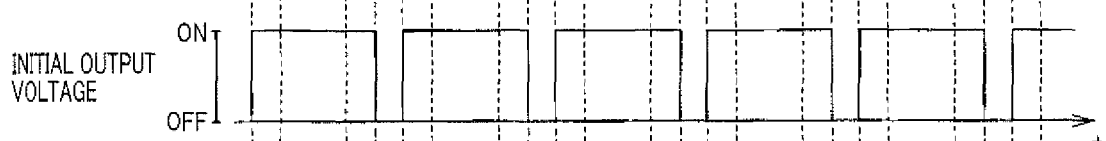
Figure 4C:
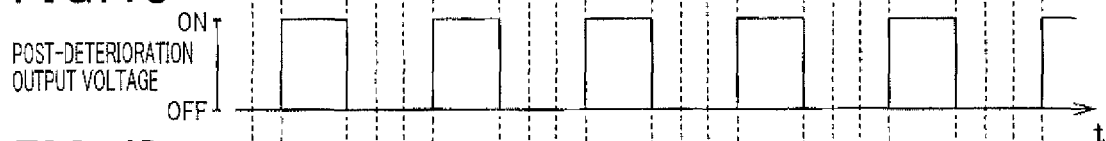

FIG. 4A is the same as FIG. 2A and indicates the alternating-current voltage outputted to the input terminal of the photocoupler 30. FIG. 4B is the same as FIG. 2B and indicates the pulse signal outputted by a predetermined photocoupler 30 that has not deteriorated. FIG. 4C is the same as FIG. 2C and indicates the pulse signal outputted by the photocoupler 30 after deterioration. In FIGS. 4A-4E, the vertical axes show amplitudes of voltage and the lateral axes show time t.

Figure 4D:
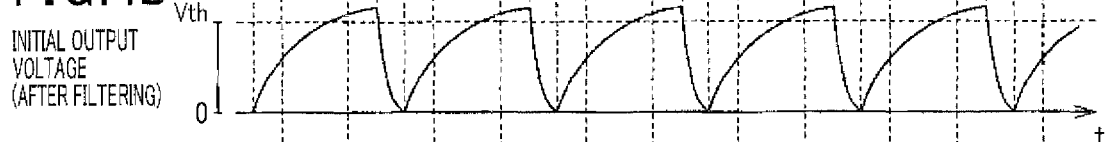
Figure 4E:
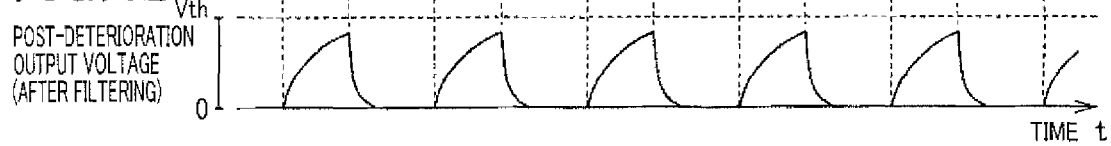

Here, the pulse signal in FIG. 4B becomes the signal indicated in FIG. 4D after having passed through the low-pass filter 50. The pulse signal in FIG. 4C becomes the signal indicated in FIG. 4E after having passed through the low-pass filter 50. In other words, the ON-period, the OFF-period, and the duty ratio of the pulse signal after having passed through the low-pass filter 50 become unclear.

According to the present embodiment, when determined that the voltage of the pulse signal that has passed through the low-pass filter 50 does not exceed the threshold Vth, the determining unit 42 determines that the photocoupler 30 has deteriorated in its performance more than its normally usable level for a user. When determined that the photocoupler 30 has deteriorated, the determining unit 42 performs a process to notify the user of the deterioration or the like (step S14 in FIG. 3).

The present embodiment that has been described in detail above has the following advantages.

When the voltage of the pulse signal that has passed through the low-pass filter 50 exceeds the threshold Vth, the photocoupler 30 is determined to have deteriorated. Therefore, even when the pulse signal passes through the low-pass filter 50, the deterioration of the photocoupler 30 can be accurately determined. Furthermore, in a configuration such as this, the deterioration of the photocoupler 30 can be easily determined.

The above-described embodiment may be modified as follows.

According to the above-described embodiment, when determined that the voltage of the pulse signal that has passed through the low-pass filter 50 does not exceed the threshold Vth, or in other words, when determined that the amount by which the pulse signal that has passed through the low-pass filter 50 exceeds the threshold Vth is zero, the determining unit 42 determines that the photocoupler 30 has deteriorated. However, the photocoupler 30 may be determined to have deteriorated when the amount by which the pulse signal that has passed through the low-pass filter 50 exceeds the threshold Vth is less that an a predetermined amount (such as a predetermined percentage of the cycle of the alternating-current voltage).

The low-pass filter 50 may be a circuit that is already present in the PLC 20 or may be a circuit that has been added to the PLC 20.

The present invention may be embodied in several other forms without departing from the spirit thereof. The embodiments described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A controller, comprising:
   an alternating-current voltage input circuit to which an alternating-current voltage is applied, the alternating-current voltage input circuit:
   having a photocoupler receiving the alternating-current voltage, and
   outputting an electric voltage pulse signal depending on performance of the photocoupler, the electric voltage pulse signal having a voltage pulse for each of positive and negative periods repeated in the alternating-current voltage; and
   an apparatus which determines deterioration in the performance of the photocoupler, the apparatus having a processor configured to:
   receive the electric voltage pulse signal outputted from the photocoupler, and detect a duty ration of the received electric voltage pulse signal;
   determine whether or not the detected duty ratio is less than a duty ratio reference threshold, the duty ratio reference threshold having been previously set based on a predetermined percentage in relation to a duty ratio of a reference photocoupler; and
   determine that the photocoupler has deteriorated in the performance thereof more than a usable level if it is determined that the detected duty ratio is less than the duty ratio reference threshold.

2. The controller of claim 1, wherein the reference photocoupler is a photocoupler that has not deteriorated.

3. The controller of claim 1, wherein the reference photocoupler is a photocoupler of which a period of use is less than a predetermined period.

4. The controller of claim 1, wherein the apparatus is incorporated in a device equipped with the photocoupler and a circuit which detects ON- and OFF-periods of the outputted voltage pulse signal from the photocoupler.

5. The controller of claim 4, wherein the device is a programmable logic controller (PLC).

6. The controller of claim 1, wherein the photocoupler comprises:
   two light-emitting elements electrically parallel connected to receive the alternating-current voltage;
   a photoelectric conversion element responding to light emission of each of the two light-emitting elements such that current is generated for each of the positive and negative periods repeated in the alternating-current voltage; and
   a circuit which receives the generated current and outputs the voltage pulse signal.

7. The controller of claim 6, wherein the processor is configured to detect the duty ratio of the received electric voltage pulse signal for each of the voltage pulse periods of the alternating-current voltage.

8. A controller, comprising:
an alternating-current voltage input circuit to which an alternating-current voltage is applied, the alternating-current voltage input circuit:
having a photocoupler receiving the alternating-current voltage, and
outputting an electric voltage pulse signal depending on performance of the photocoupler, the electric voltage pulse signal having a voltage pulse for each of positive and negative periods repeated in the alternating-current voltage;
a low-pass filter:
receiving the electric voltage pulse signal from the photocoupler, and
reducing high-frequency components from the received electric voltage pulse signal; and
an apparatus which determines the deterioration in the performance of the photocoupler, the apparatus having a processor configured to:
receive a filtered voltage pulse signal outputted from the low-pass filter;
determine whether or not an amount indicating a waveform of a voltage amplitude of the filtered voltage pulse signal for each of positive and negative periods repeated in the alternating-current voltage is less than a predetermined amount, the amount showing a percentage of one cycle of the filtered voltage pulse signal obtained for a period during which the filtered voltage pulse signal exceeds a voltage threshold, the voltage threshold being set previously for determining deterioration of the photocoupler; and
determine that the photocoupler has deteriorated in the performance thereof more than a usable level if it is determined that the amount is less than the predetermined amount.

9. The controller of claim 8, wherein the apparatus is incorporated in a device equipped with the photocoupler and a circuit which detects ON- and OFF-periods of the outputted voltage pulse signal from the photocoupler.

10. The controller of claim 9, wherein the device is a programmable logic controller (PLC).

11. The controller of claim 8, wherein the amount is the percentage of the one cycle of the outputted pulse signal.

12. The controller of claim 8, wherein the photocoupler comprises:
two light-emitting elements electrically parallel connected to receive the alternating-current voltage;
a photoelectric conversion element responding to light emission of each of the two light-emitting elements such that current is generated to each of the positive and negative periods repeated in the alternating-current voltage; and
a circuit which receives the generated current and outputs the voltage pulse signal.

* * * * *